(12) United States Patent
Shibata

(10) Patent No.: US 9,894,804 B2
(45) Date of Patent: Feb. 13, 2018

(54) ELECTRONIC CONTROL UNIT AND ELECTRIC POWER STEERING APPARATUS HAVING THE SAME

(71) Applicant: DENSO CORPORATION, Kariya, Aichi-pref. (JP)

(72) Inventor: Shinji Shibata, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/582,529

(22) Filed: Dec. 24, 2014

(65) Prior Publication Data

US 2015/0189733 A1    Jul. 2, 2015

(30) Foreign Application Priority Data

Dec. 26, 2013  (JP) .................................. 2013-269401

(51) Int. Cl.
| | |
|---|---|
| *H01L 23/36* | (2006.01) |
| *H05K 7/20* | (2006.01) |
| *B62D 5/04* | (2006.01) |
| *H05K 1/02* | (2006.01) |

(52) U.S. Cl.
CPC ........... *H05K 7/2039* (2013.01); *H05K 1/021* (2013.01); *H05K 1/0204* (2013.01); *H05K 2201/066* (2013.01)

(58) Field of Classification Search
None
See application file for complete search history.

(56) References Cited

U.S. PATENT DOCUMENTS

| | | | | | |
|---|---|---|---|---|---|
| 7,365,425 | B2 * | 4/2008 | Hayakawa | .......... | H01L 23/4006 257/712 |
| 8,132,615 | B2 * | 3/2012 | Lin | ....... | H01L 23/427 165/104.21 |
| 9,099,901 | B2 * | 8/2015 | Fujimoto | ............. | B62D 5/0406 |
| 9,472,486 | B2 * | 10/2016 | Maier | ..................... | H01L 23/36 |

(Continued)

FOREIGN PATENT DOCUMENTS

| | | |
|---|---|---|
| JP | 10-084063 A | 3/1998 |
| JP | 2001-344044 A | 12/2001 |

(Continued)

OTHER PUBLICATIONS

Nishimura, U.S. Appl. No. 14/582,465, filed Dec. 24, 2014.

(Continued)

*Primary Examiner* — Thomas G Black
*Assistant Examiner* — Demetra Smith-Stewart
(74) *Attorney, Agent, or Firm* — Nixon & Vanderhye P.C.

(57) ABSTRACT

An electronic control unit includes a board, a high-heat-generating device, a controller, a heat-dissipating member, and a heat-conducting member. The high-heat-generating device is mounted on a surface of the board. The heat-dissipating member has a surface located facing the surface of the board. The surface of the heat-dissipating member is recessed to form a recess capable of holding the high-heat-generating device. The heat-conducting member is located between the board and the heat-dissipating member and in contact with both the high-heat-generating device and the recess to transfer the heat of the high-heat-generating device to the heat-dissipating member. The recess is shaped to match a shape of the high-heat-generating device.

37 Claims, 5 Drawing Sheets

(56) References Cited

U.S. PATENT DOCUMENTS

| | | | |
|---|---|---|---|
| 2008/0032347 A1* | 2/2008 | Sarofim | B01L 7/52 435/91.2 |
| 2010/0065307 A1* | 3/2010 | Nagase | H05K 1/021 174/252 |
| 2010/0213603 A1* | 8/2010 | Smeys | H01L 21/4853 257/698 |
| 2011/0012256 A1* | 1/2011 | Oota | H01L 23/047 257/712 |
| 2011/0013370 A1 | 1/2011 | Oota | |
| 2012/0057318 A1 | 3/2012 | Oota | |
| 2013/0003303 A1* | 1/2013 | Lindgren | H01L 23/367 361/704 |
| 2014/0077349 A1* | 3/2014 | Higgins, III | H01L 21/565 257/692 |
| 2014/0225482 A1 | 8/2014 | Hara et al. | |
| 2014/0254105 A1* | 9/2014 | Uchida | H02M 7/003 361/720 |
| 2015/0201486 A1* | 7/2015 | Voelker | H05K 7/2039 361/709 |

FOREIGN PATENT DOCUMENTS

| | | |
|---|---|---|
| JP | 2005-129820 A | 5/2005 |
| JP | 2012-079811 A | 4/2012 |

OTHER PUBLICATIONS

Nishimoto et al., U.S. Appl. No. 14/582,898, filed Dec. 24, 2014.
Tashima, et al., U.S. Appl. No. 14/582,877, filed Dec. 24, 2014.
Mar. 1, 2016 Notice of Reason for Refusal issued in Japanese Patent Application No. 2013-269401 (with translation).

* cited by examiner

ELECTRONIC CONTROL UNIT AND ELECTRIC POWER STEERING APPARATUS HAVING THE SAME

CROSS REFERENCE TO RELATED APPLICATION

This application is based on and claims priority to Japanese Patent Application No. 2013-269401 filed on Dec. 26, 2013, the contents of which are incorporated herein by reference.

FIELD

The present disclosure relates to an electronic control unit for controlling a control target and an electric power steering apparatus having the electronic control unit.

BACKGROUND

An electronic control unit in which high-heat-generating devices, such as switching devices, are mounted on a circuit board is known. The high-heat-generating device generates a lot of heat when the electronic control unit operates. For example, in an electronic control unit disclosed in JP-A-2011-23459 corresponding to US 2011/0013370A1, switching devices as high-heat-generating devices are mounted on a surface of a circuit board, and a surface of a heat-dissipating member is located facing the surface of the board.

In the electronic control unit disclosed in JP-A-2011-23459, the switching device is held in a room formed in the heat-dissipating member. However, the room is not shaped to match the shape of the switching device, and the capacity of the room is a few times larger than the volume of the switching device. For this reason, in the assembled condition of the electronic control unit, there is a large distance between the inner wall of the room and the outer wall of the switching device. Accordingly, it may be difficult to efficiently transfer heat of the switching device to the heat-dissipating member. As a result, the heat of the switching device is not efficiently dissipated through the heat-dissipating member.

Further, in the assembled condition of the electronic control unit disclosed in JP-A-2011-23459, there is a large distance between the facing surfaces of the heat-dissipating member and the board. Accordingly, it may be difficult to transfer the heat of the switching device to the heat-dissipating member through the board.

Furthermore, in the assembled condition of the electronic control unit disclosed in JP-A-2011-23459, a heat-conducting member is provided in each room. Accordingly, the number of man-hours needed to place the heat-conducting member may be increased.

In particular, the electronic control unit disclosed in JP-A-2011-23459 is used to control a motor of an electric power steering apparatus for a vehicle. When the motor of the electric power steering apparatus is driven and produces assisting-torque to help a driver to steer the vehicle, a large current flows through the motor and the high-heat-generating devices of the electronic control unit. Therefore, when the motor is driven, the high-heat-generating devices generate a lot of heat. For this reason, when an electronic control unit is used to control a motor of an electric power steering apparatus, it is preferable that heat of high-heat-generating devices of the electronic control unit should be dissipated efficiently.

SUMMARY

In view of the above, it is an object of the present disclosure to provide an electronic control unit in which heat generated in a high-heat-generating device is highly efficiently dissipated and to provide an electric power steering apparatus having the electronic control unit.

According to an aspect of the present disclosure, an electronic control unit includes a board, a high-heat-generating device, a controller, a heat-dissipating member, and a heat-conducting member. The high-heat-generating device is mounted on a surface of the board and configured to generate heat greater than a predetermined heat value when the electronic control unit operates. The controller controls a control target by controlling the high-heat-generating device. The heat-dissipating member has a surface located facing the surface of the board. The surface of the heat-dissipating member is recessed to form a recess capable of holding the high-heat-generating device. The heat-conducting member is located between the board and the heat-dissipating member and in contact with both the high-heat-generating device and the recess to transfer the heat of the high-heat-generating device to the heat-dissipating member. The recess is shaped to match a shape of the high-heat-generating device.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
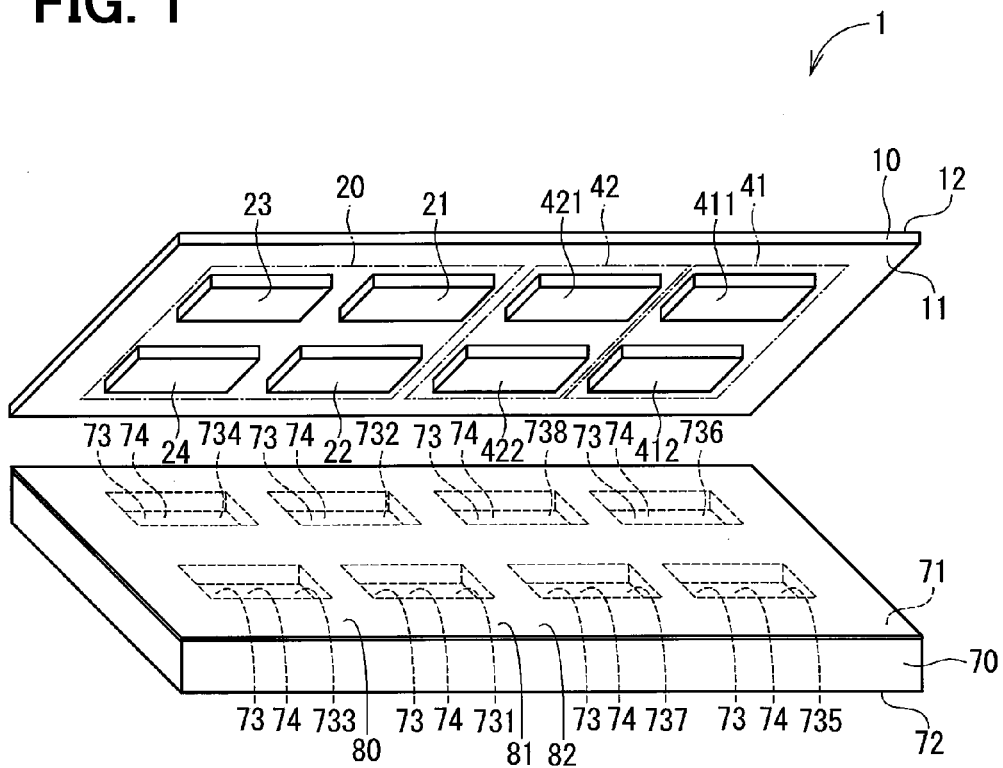
FIG. 1 is a diagram illustrating a partially exploded view of an electric control unit according to a first embodiment of the present disclosure.

Embodiments of the present disclosure are described below with reference to the drawings in which like characters of reference indicate the same or equivalent parts. For the sake of simplicity, a reference character may be assigned to only one of the same or equivalent parts in the drawings.

First Embodiment

Figure 2:
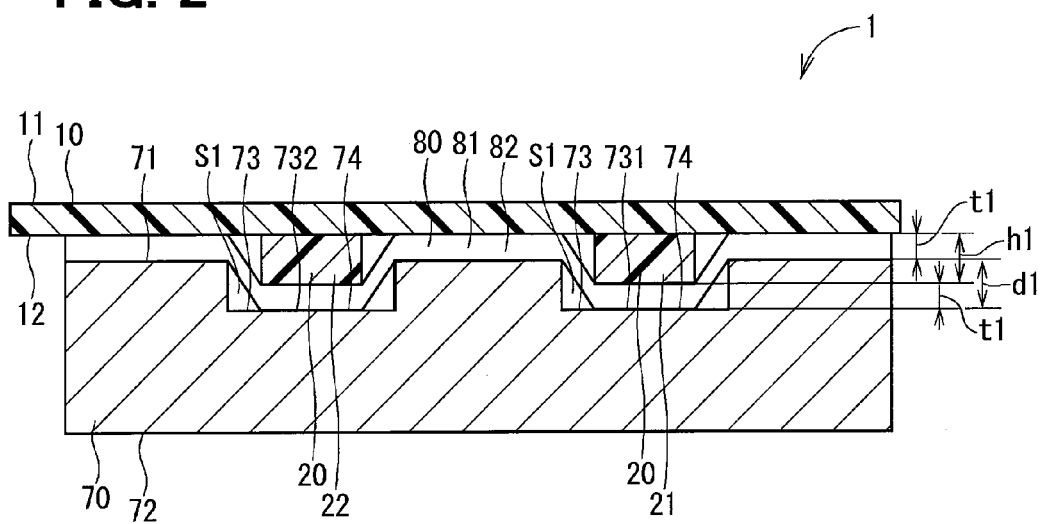
FIG. 2 is a diagram illustrating a partially cross-sectional view of the electric control unit according to the first embodiment of the present disclosure.
Figure 3:
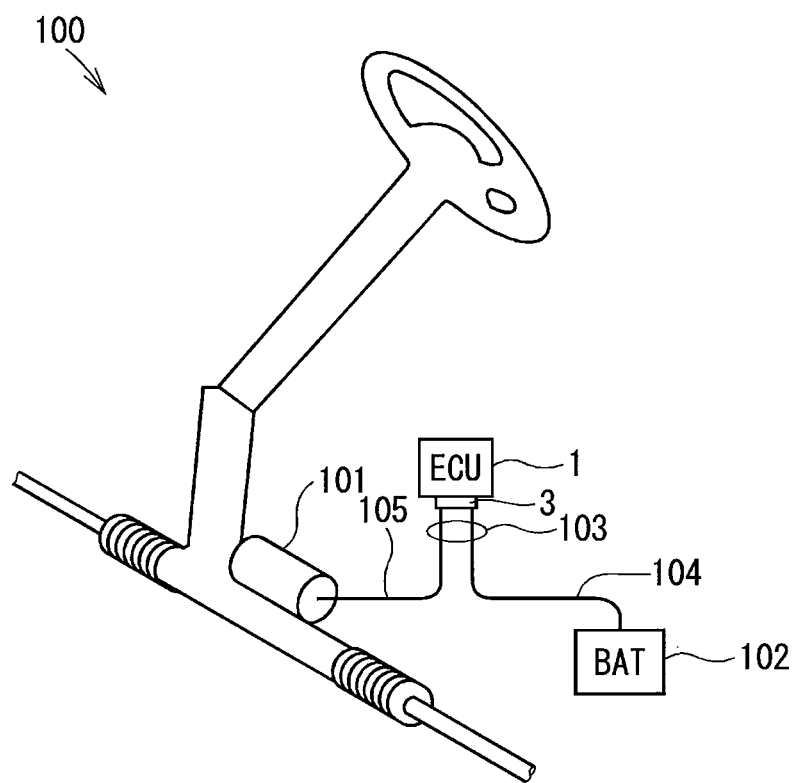
FIG. 3 is a diagram illustrating a structure of an electric power steering apparatus in which the electronic control unit according to the first embodiment of the present disclosure is used.

An electronic control unit 1 according to a first embodiment of the present embodiment is described below with reference to FIGS. 1-4. As shown in FIG. 3, the electronic control unit 1 is used in an electric power steering apparatus 100 of a vehicle. The electronic control unit 1 drives and controls a motor 101 based on a steering torque signal and a vehicle speed signal so that the motor 101 can produce assisting-torque to help a driver to steer the vehicle. The motor 101 corresponds to a control target recited in claims.

The electronic control unit 1 includes a circuit board 10, a switching device 20, a capacitor 30, relays 41 and 42, a coil 51, a shunt resistor 52, a power Zener diode 53, and a controller 60, a heatsink 70 serving as a heat-dissipating member, and a heat-conducting member 80.

The board 10 is a printed circuit board such as a FR4 (Flame Retardant Type 4) made of a glass woven fabric with epoxy resin.

The switching device 20 is a semiconductor device such as a metal-oxide-semiconductor field-effect transistor (MOSFET) and an insulated-gate bipolar transistor (IGBT). According to the first embodiment, four switching devices 20 are mounted on the board 10. The four switching devices 20 are hereinafter sometimes collectively referred to as the "switching device 20" and also sometimes individually referred to as the "switching devices 21, 22, 23, and 24". For example, as shown in FIGS. 1 and 2, each of the switching devices 21-24 is covered with a sealing resin and thus shaped like a rectangular plate. That is, each of the switching devices 21-24 is hexahedron and has six rectangular outer walls: a top wall, a bottom wall, and four side walls. Each of the switching devices 21-24 is mounted on a first surface 11 of the board 10 in such a manner that the bottom wall faces and is parallel to the first surface 11.

For example, the capacitor 30 is an aluminum electrolytic capacitor and shaped like a cylindrical column. Although not shown in the drawings, for example, the capacitor 30 is mounted on a second surface 12 of the board 10 opposite to the first surface 11 in such a manner that an axis of the capacitor 30 is perpendicular to the second surface 12.

The relay 41 includes switching devices 411 and 412. Like the switching device 20, each of the switching devices 411 and 412 is a semiconductor device such as a MOSFET and an IGBT. For example, as shown in FIG. 1, each of the switching devices 411 and 412 is covered with a sealing resin and thus shaped like a rectangular plate. That is, each of the switching devices 411 and 412 is hexahedron and has six rectangular outer walls: a top wall, a bottom wall, and four side walls. Each of the switching devices 411 and 412 is mounted the first surface 11 of the board 10 in such a manner that the bottom wall faces and is parallel to the first surface 11.

The relay 42 includes switching devices 421 and 422. Like the switching devices 411 and 412, each of the switching devices 421 and 422 is a semiconductor device such as a MOSFET and an IGBT. For example, as shown in FIG. 1, each of the switching devices 421 and 422 is covered with a sealing resin and thus shaped like a rectangular plate. That is, each of the switching devices 421 and 422 is hexahedron and has six rectangular outer walls: a top wall, a bottom wall, and four side walls. Each of the switching devices 421 and 422 is mounted the first surface 11 of the board 10 in such a manner that the bottom wall faces and is parallel to the first surface 11.

For example, the coil 51 is a choke coil and has an outer shape like a rectangular column. Although not shown in the drawings, the coil 51 is mounted on the second surface 12 of the board 10 in such a manner that its height direction is perpendicular to the second surface 12.

For example, the shunt resister 52 is shaped like a rectangular plate. Although not shown in the drawings, the shunt resister 52 is mounted on the first surface 11 of the board 10 in such a manner that its surface direction is parallel to the first surface 11.

For example, the power Zener diode 53 is shaped like a rectangular plate and has a volume greater than a predetermined volume value. Although not shown in the drawings, the power Zener diode 53 is mounted on the first surface 11 of the board 10 near the switching device 20 in such a manner that its surface direction is perpendicular to the first surface 11.

For example, the controller 60 includes a microcomputer 61 and a custom integrated circuit (IC) 62. For example, each of the microcomputer 61 and the custom IC 62 is a semiconductor package having a central processing unit (CPU), a read-only memory (ROM), a random access memory (RAM), and an input output (I/O) section. The controller 60 controls the relays 41, 42 and the switching devices 21-24. The controller 60 drives and controls the motor 101 by controlling the switching devices 21-24 based on signals from sensors mounted on the vehicle. According to the first embodiment, the motor 101 is a brushed DC motor.

Although not shown in the drawings, for example, the microcomputer 61 is mounted on the second surface 12 of the board 10, and the custom IC 62 is mounted on the first surface 11 of the board 10.

Next, electrical connections among the switching devices 21-24, the capacitor 30, the relays 41, 42, the coil 51, the shunt resistor 52, the power Zener diode 53, and the controller 60 are described with reference to FIG. 4.

A positive terminal of a battery 102 serving as a power source of the vehicle is connected to the relay 41. The relay 41 is switched ON and OFF by the controller 60 so that supply of power from the battery 102 to the electronic control unit 1 can be allowed or stopped. Thus, the relay 41 acts as a power supply relay.

The power from the battery 102 is supplied to the switching devices 21-24 through the coil 51. The coil 51 eliminates noise from the power which is supplied from the battery 102 to the motor 101 through the electronic control unit 1.

An ignition power source 106 of the vehicle is connected to the controller 60 and a node between the relay 41 and the coil 51. The controller 60, i.e., the microcomputer 61 and the custom IC 62 operate on power from the ignition power source 106.

Figure 4:
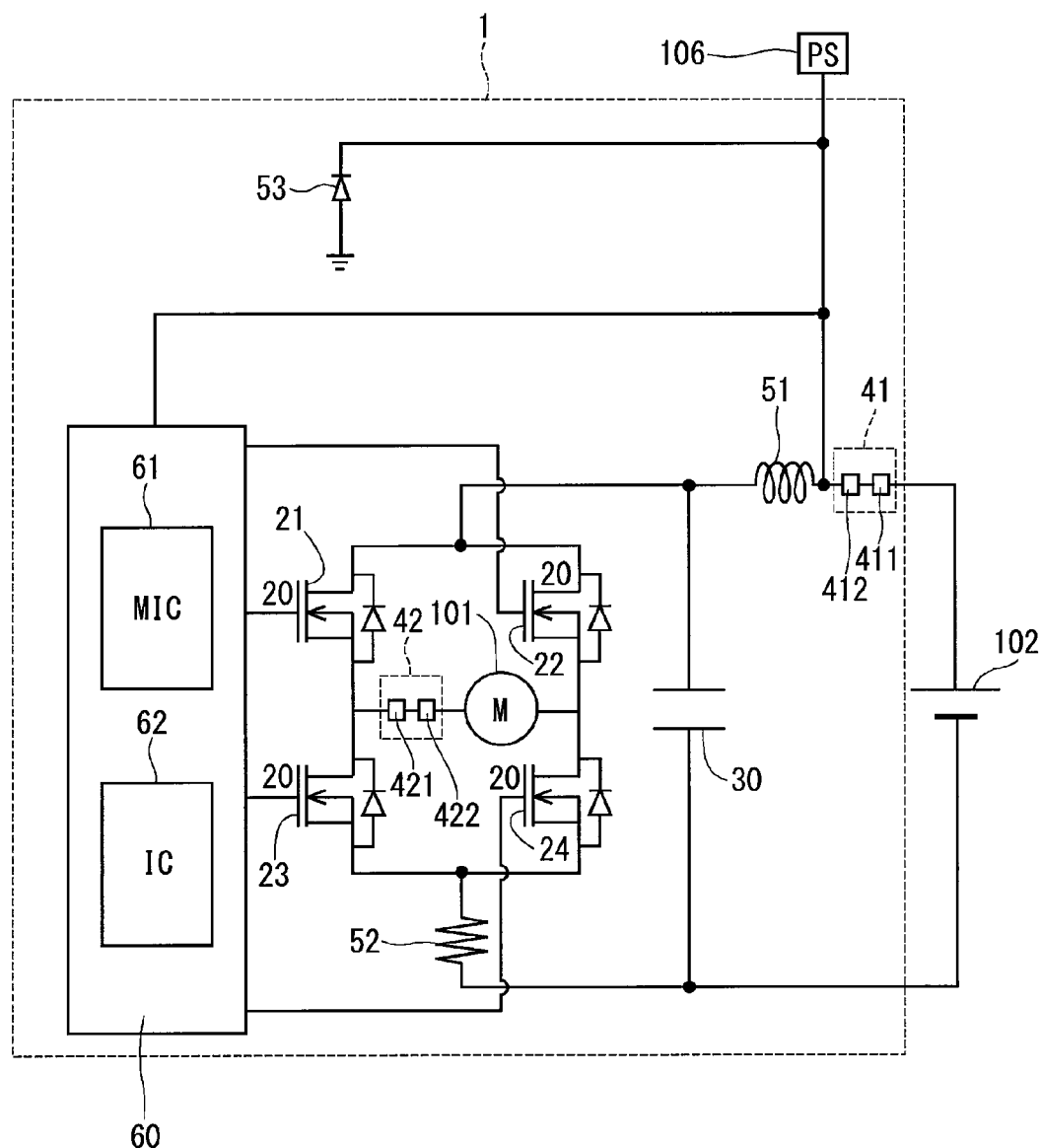
FIG. 4 is a diagram illustrating a circuit structure of the electric control unit according to the first embodiment of the present disclosure.

As shown in FIG. 4, the switching devices 21 and 23 are connected in series, and the switching devices 22 and 24 are connected in series. A series circuit of the switching devices 21 and 23 is connected in parallel to a series circuit of the switching devices 22 and 24.

The relay 42 and the motor 101 are connected between a node between the switching devices 21 and 23 and a node between the switching devices 22 and 24. In this way, the switching devices 21-24 are connected to form a H-bridge circuit. The shunt resistor 52 is connected to ground-side terminals of the switching devices 23 and 24. The capacitors 30 are connected in parallel between a power supply line and a ground line. The capacitors 30 reduce a surge voltage occurring when the switching devices 21-24 are switched ON and OFF.

According to the above electrical connections, for example, when the switching devices 21 and 24 are ON, and the switching devices 22 and 23 are OFF, an electric current flows through the switching device 21, the relay 42, the motor 101, and the switching device 24 in the order mentioned. In contrast, when the switching devices 21 and 24 are OFF, and the switching devices 22 and 23 are ON, an electric current flows through the switching device 22, the motor 101, the relay 42, and the switching device 23 in the order mentioned. Since the motor 101 is a brushed DC motor, the motor 101 is driven and rotates when the switching devices 21-24 of the H-bridge circuit are switched ON and OFF in the above manner. Signal lines from the custom IC. 62 of the controller 60 are separately connected to the switching devices 21-24 so that the controller 60 can control the switching of the switching devices 21-24. Thus, the controller 60 drives and controls the motor 101 by controlling the switching of the switching devices 21-24. Since the controller 60 controls the switching devices 21-24 based on an electric current detected by the shunt resistor 52, the controller 60 can accurately control the switching devices 21-24, and by extension, the motor 101.

The relay 42 is switched ON and OFF by the controller 60 so that supply of power from the battery 102 to the motor 101 can be allowed or stopped. Thus, the relay 42 acts as a motor relay.

A relatively large current flows through the switching device 20, the capacitor 30, the relays 41, 42, the coil 51, and the shunt resistor 52 during the switching of the switching device 20. Therefore, when the electronic control unit 1 operates, the switching device 20, the capacitor 30, the relays 41, 42, the coil 51, and the shunt resistor 52 generate heat greater than a predetermined heat value, and their temperatures become relatively high. Each of the switching device 20, the capacitor 30, the relays 41, 42, the coil 51, and the shunt resistor 52 corresponds to a high-heat-generating device recited in claims.

One end of the power Zener diode 53 is connected to the ignition power source 106, the controller 60, and the node between the relay 41 and the coil 51. The other end of the power Zener diode 53 is connected to a ground.

In normal times where the power supplied from the ignition power source 106 to the electronic control unit 1 is not greater than a predetermined threshold, the power Zener diode 53 prevents an electric current from flowing from the ignition power source 106 to the ground through it. In contrast, when the power supplied from the ignition power source 106 to the electronic control unit 1 is greater than the threshold, the power Zener diode 53 allows an electric current to flow from the ignition power source 106 to the ground through it. Thus, the power Zener diode 53 prevents a large current from flowing from the ignition power source 106 to the electronic control unit 1, in particular, the controller 60. In this way, the power Zener diode 53 serves as a protection device for protecting the electronic control unit 1 from a large current.

As described above, in normal times, the power Zener diode 53 does not pass an electric current. That is, when the electronic control unit 1 operates, the power Zener diode 53 does not generate heat greater than the predetermined heat value. The power Zener diode 53 corresponds to a low-heat-generating device recited in claims.

The power Zener diode 53 is arranged near the switching device 20 and also serves as a heat mass/capacity member. Therefore, during the switching of the switching device 20, part of the heat of the switching device 20 is transmitted to the power Zener diode 53, and a temperature of the power Zener diode 53 is increased accordingly.

According to the first embodiment, the switching device 20, the capacitor 30, the relays 41, 42, the coil 51, the shunt resistor 52, and the power Zener diode 53 are so-called surface-mount devices (SMDs).

The heatsink 70 is made of a metal such as aluminum. For example, the heatsink 70 is shaped like a rectangular plate and has first and second surfaces 71 and 72 opposite to each other. The heatsink 70 is fixed to the board 10 by fasteners or the like in such a manner that the first surface 71 faces the first surface 11 of the board 10. As shown in FIG. 2, in an assembled condition of the electronic control unit 1, there is a predetermined clearance between the first surface 71 of the heatsink 70 and the first surface 11 of the board 10.

In the heatsink 70, the first surface 71 is recessed at multiple positions toward the second surface 72 of the heatsink 70 opposite to the first surface 71 so that multiple recesses 73 can be formed. The recesses 73 are hereinafter sometimes collectively referred to as the "recess 73" and also sometimes individually referred to as the "recesses 731, 732, 733, 734, 735, 736, 737, and 738". The recesses 731, 732, 733, 734, 735, 736, 737, and 738 are shaped to hold the switching devices 21, 22, 23, 24, 411, 412, 421, and 422, respectively.

The heat-conducting member 80 includes an electrically-insulating, heat-dissipating sheet 81 and a heat-dissipating grease 82. For example, the heat-dissipating sheet 81 is an electrically-insulating sheet containing silicon and having a low thermal resistance. For example, the heat-dissipating grease 82 is a gel of grease mainly containing silicon and having a low thermal resistance.

The heat-conducting member 80 is located between the first surface 11 of the board 10 and the first surface 71 of the heatsink 70 and in contact with at least the switching device 20, the relays 41, 42, and the heatsink 70. According to the first embodiment, the heat-conducting member 80 is in contact with the shunt resistor 52 and the power Zener diode 53 in addition to the switching device 20, the relays 41, 42, and the heatsink 70. Thus, the heat-conducting member 80 leads the heat of the switching device 20, the relays 41, 42, the shunt resistor 52, and the power Zener diode 53 to the heatsink 70.

Further, as shown in FIG. 2, the heat-conducting member 80 is in contact with both the first surface 11 of the board 10 and the first surface 71 of the heatsink 70. Thus, the heat-conducting member 80 leads the heat, which is transmitted to the board 10 from the switching device 20, the relays 41, 42, the shunt resistor 52, the power Zener diode 53, the capacitor 30, and the coil 51, to the heatsink 70.

According to the first embodiment, multiple heat-conducting members 80 are provided at positions corresponding to the switching device 20, the shunt resistor 52, the power Zener diode 53, the capacitor 30, the relays 41, 42, and the coil 51 and integrated together as one heat-conducting member 80. For this reason, in the drawings, the heat-conducting members 80 apparently look like one heat-conducting member 80.

The recesses 731, 732, 733, 734, 735, 736, 737, and 738 are respectively shaped to match shapes of the switching devices 21, 22, 23, 24, 411, 412, 421, and 422. That is, each of the recesses 731, 732, 733, 734, 735, 736, 737, and 738 has five rectangular inner walls facing the outer walls, except the bottom wall, of a corresponding one of the switching devices 21, 22, 23, 24, 411, 412, 421, and 422.

For example, the recesses 731, 732, 733, 734, 735, 736, 737, and 738 are respectively shaped to match the shapes of the switching devices 21, 22, 23, 24, 411, 412, 421, and 422 so that a clearance between the inner wall of each of the recesses 731, 732, 733, 734, 735, 736, 737, and 738 and the corresponding outer wall of each of the switching devices 21, 22, 23, 24, 411, 412, 421, and 422 can be less than a predetermined distance in the assembled condition of the electronic control unit 1.

As shown in FIG. 2, the recess 73 has a depth d1 which is a distance from the first surface 71 of the heatsink 70 to a bottom wall 74 of the recess 73. The bottom wall 74 is parallel to the first surface 71. The depth d1 is equal to a height h1 of a corresponding one of the switching devices 21, 22, 23, 24, 411, 412, 421, and 422. The height h1 is measured from the first surface 11 of the board 10.

In the assembled condition of the electronic control unit 1, a distance t1 between the first surface 11 of the board 10 and the first surface 71 of the heatsink 70 is less than the depth d1 and the height h1, and part (i.e., top wall side) of each of the switching device 20, the relay 41, and the relay 42 is located inside the recess 73. Further, a distance between the bottom wall 74 of the recess 73 and each of the switching device 20, the relay 41, and the relay 42 is equal to the distance t1.

A thickness of the heat-conducting member 80 is a little greater than the distance t1. Therefore, as shown in FIG. 2, in the assembled condition of the electronic control unit 1, the heat-conducting member 80 remains compressed between the bottom wall 74 of the recess 73 and each of the switching device 20 and the relays 41, 42 and also remains compressed between the first surface 11 of the board 10 and the first surface 71 of the heatsink 70.

The four side walls of the recess 73 are perpendicular to the first surface 71 of the heatsink 70 and the bottom wall 74 of the recess 73. Accordingly, in the assembled condition of the electronic control unit 1, there is a space S1 between the heat-conducting member 80 and the recess 73.

As shown in FIG. 3, the electronic control unit 1 further includes a connector 3. For example, the connector 3 has a rectangular tube-shaped housing made of resin and multiple terminals, including a PIG terminal (i.e., power supply terminal or positive side terminal), a ground terminal, and a motor terminal, provided in the housing. The connector 3 is connected to a harness 103. A wire 104 of the harness 103 electrically connects the positive terminal of the battery 102 to the PIG terminal of the connector 3. Although not shown in the drawings, the PIG terminal is connected to the relay 41 through a wiring pattern. A wire 105 of the harness 103 electrically connects a winding terminal of the motor 101 to the motor terminal of the connector 3.

Next, operations of the electronic control unit 1 are described.

When a driver of the vehicle turns ON an ignition switch of the vehicle, power is supplied to the electronic control unit 1 from the ignition power source 106, and the electronic control unit 1 is activated. When the electronic control unit 1 is activated, the controller 60 turns ON the relays 41 and 42. Accordingly, the supply of the power from the battery 102 to the motor 101 is allowed.

During an ON-period of the ignition switch, the controller 60 drives and controls the motor 101 by controlling the switching of the switching device 20 based on the steering torque signal and the vehicle speed signal. Accordingly, the motor 101 produces assisting-torque to help the driver to steer the vehicle.

When the controller 60 drives and controls the motor 101 by controlling the switching of the switching device 20, a relatively large current flows through the switching device 20, the capacitor 30, the relays 41, 42, the coil 51, and the shunt resistor 52. Accordingly, the switching device 20, the capacitor 30, the relays 41, 42, the coil 51, and the shunt resistor 52 generate heat, and their temperatures become relatively high. It is noted that part of the heat of the switching device 20 is led to the power Zener diode 53 which is capable of serving as a heat mass/capacity member.

The heat of the switching device 20, the relays 41, 42, the shunt resistor 52, and the power Zener diode 53 is led to the heatsink 70 through the heat-conducting member 80. In particular, the heat of the switching device 20 and the relays 41, 42 is led to the recess 73 of the heatsink 70 through the heat-conducting member 80.

Further, the heat of the switching device 20, the relays 41, 42, the shunt resistor 52, the power Zener diode 53, the capacitor 30, and the coil 51 is led to the heatsink 70 through the board 10 and the heat-conducting member 80 which is in contact with the board 10 and the heatsink 70.

Thus, when the electronic control unit 1 operates, the heat of the switching device 20, the relays 41, 42, the shunt resistor 52, the power Zener diode 53, the capacitor 30, and the coil 51 is led to the heatsink 70 efficiently. Therefore, the heat of high-heat-generating devices including the switching device 20, the relays 41, 42, the shunt resistor 52, the capacitor 30, and the coil 51 can be dissipated to the heatsink 70 efficiently.

In summary, the first embodiment can have the following features (1)-(7).

(1) The switching device 20 and the relays 41, 42, which are defined as high-heat-generating devices, are mounted on the first surface 11 of the board 10 and generate heat greater than a predetermined heat value when the electronic control unit 1 operates.

The controller 60 controls the motor 101 by controlling the switching device 20.

The heatsink 70 is fixed to the board 10 in such a manner that the first surface 71 of the heatsink 70 faces the first surface 11 of the board 10, where the switching device 20 and the relays 41, 42 are mounted. The first surface 71 of the heatsink 70 is recessed to form the recesses 73 capable of holding the switching device 20 and the relays 41, 42 mounted in the first surface 11 of the board 10.

The heat-conducting member 80 is located between the board 10 and the heatsink 70 and in contact with at least the switching device 20, the relays 41, 42, and the recess 73 of the heatsink 70. Thus, the heat-conducting member 80 leads the heat of the switching device 20 and the relays 41, 42 to the heatsink 70.

The recesses 73 are shaped to match the shapes of the switching devices 20 and the relays 41, 42 mounted on the first surface 11 of the board 10. Therefore, in the assemble condition of the electronic control unit 1, a space between the outer wall of each of the switching device 20 and the relays 41, 42 and the inner wall of the corresponding one of the recesses 73 can be reduced. Thus, the heat of the switching device 20 and the relays 41, 42 can be efficiently led to the heatsink 70 through the heat-conducting member 80 and accordingly efficiently dissipated.

The switching device 20 and the relays 41, 42 are held in the recesses 73 of the heatsink 70. Thus, in the assembled condition of the electronic control unit 1, the first surface 11 of the board 10 can be located as close as possible to the first surface 71 of the heatsink 70. Therefore, the heat of the switching device 20, the relays 41, 42, the shunt resistor 52, and the capacitor 30, and the coil 51 can be efficiently led to the heatsink 70 through the board 10.

(2) The heat-conducting member 80 is in contact with both the board 10 and the heatsink 70. Thus, the heat of the switching device 20, the relays 41, 42, the shunt resistor 52, and the capacitor 30, and the coil 51 can be more efficiently led to the heatsink 70 through the board 10 and the heat-conducting member 80.

(3) The heatsink 70 has multiple recesses 73 so that multiple high-heat-generating devices mounted on the first surface 11 of the board 10 can be held in the recesses 73. Thus, each high-heat-generating device mounted on the first surface 11 of the board 10 can be effectively dissipated through the corresponding recess 73.

(4) Multiple heat-conducting members 80 are provided at positions corresponding to the switching device 20, the relays 41, 42, the shunt resistor 52, the power Zener diode 53, the capacitor 30, and the coil 51. Thus, the heat of each of the switching device 20, the relays 41, 42, the shunt resistor 52, the power Zener diode 53, the capacitor 30, and the coil 51 can be led to the heatsink 70 through the respective heat-conducting members 80.

(5) The heat-conducting members 80 are integrated together as one heat-conducting member 80 and apparently look like one heat-conducting member 80. Therefore, the heat-conducting member 80 can be easily adhered or applied between the board 10 and the heatsink 70.

Since the switching device 20 and the relays 41, 42 are collectively arranged within a predetermined region of the first surface 11 of the board 10, the heat-conducting members 80 can be integrated together as one heat-conducting member 80 as described above. That is, there is no need that the heat-conducting members 80 are separately provided at positions corresponding to the switching device 20 and the relays 41, 42.

(6) The depth d1 of the recess 73 from the first surface 71 of the heatsink 70 is equal to the height h1 of the corresponding one of the switching device 20 and the relays 41, 42. Therefore, in the assembled condition of the electronic control unit 1, the distance between the bottom wall 74 of the recess 73 and each of the switching device 20, the relay 41, and the relay 42 becomes equal to the distance t1 between the first surface 11 of the board 10 and the first surface 71 of the heatsink 70. Thus, the thickness of the heat-conducting member 80 can be uniform in its surface direction so that the heat-conducting member 80 can be manageable.

(7) The electric power steering apparatus 100 includes the electronic control unit 1 and the motor 101. The motor 101 is controlled by the electronic control unit 1 so that the motor 101 can produce assisting-torque to help the driver to steer the vehicle.

A large amount of heat is generated in the electric power steering apparatus 100 due to a large current flowing in it. Due to its high heat dissipation efficiency, the electronic control unit 1 can be suitably used in the electric power steering apparatus 100.

Second Embodiment

Figure 5:
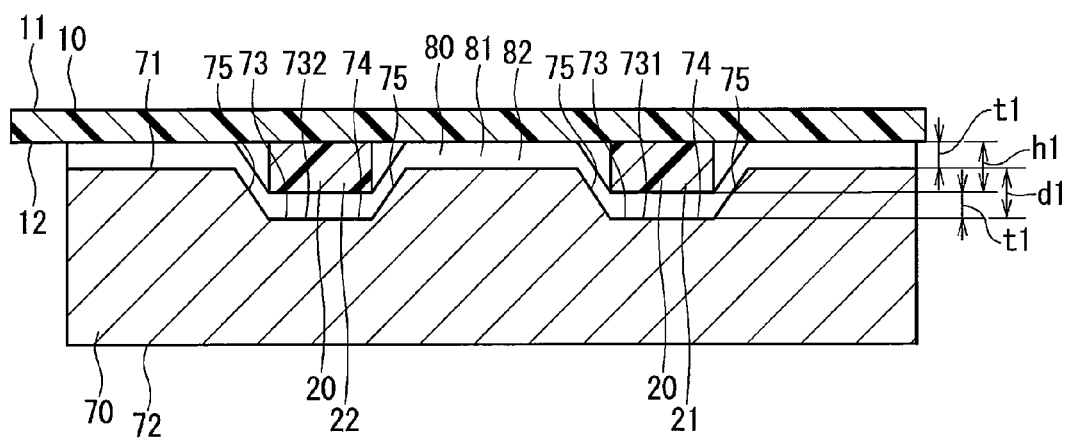
FIG. 5 is a diagram illustrating a partially cross-sectional view of an electric control unit according to a second embodiment of the present disclosure.

A second embodiment of the present disclosure is described below with reference to FIG. 5. The second embodiment differs from the first embodiment in the structure of the recess 73.

According to the second embodiment, four side walls 75 of the recess 73 are inclined with respect to both the first surface 71 of the heatsink 70 and the bottom wall 74 of the recess 73.

Each side wall 75 of the recess 73 is connected to the first surface 71 of the heatsink 70 so that a corner formed by the side wall 75 and the first surface 71 can have an obtuse angle. Thus, stress applied to the heat-conducting member 80 by the corner is reduced, and local stress in the heat-conducting member 80 is reduced.

Further, in the assembled condition of the electronic control unit 1, there is no space S1 between the heat-conducting member 80 and the recess 73 due to the inclination of the side wall 75 with respect to the first surface 71. Accordingly, the heat-conducting member 80 can be in tight contact with the inner walls 74, 75 of the recess 73.

As described above, according to the second embodiment, the side walls 75 of the recess 73 are inclined with respect to the first surface 71 of the heatsink 70. Each side wall 75 is connected to the first surface 71 of the heatsink 70 so that the corner formed by the side wall 75 and the first surface 71 can have an obtuse angle. Thus, the stress applied to the heat-conducting member 80 by the corner is reduced, and the local stress in the heat-conducting member 80 is reduced. Therefore, the heat-conducting member 80 is less likely to be damaged and broken.

Further, in the assembled condition of the electronic control unit 1, the heat-conducting member 80 is in tight contact with the inner walls 74, 75 of the recess 73 due to the inclination of the side wall 75 with respect to the first surface 71. Thus, the heat of the switching device 20 and the relays 41, 42 can be more efficiently led to the heatsink 70 through the heat-conducting member 80. In this way, the heat of the high-heat-generating devices can be dissipated highly efficiently.

Third Embodiment

Figure 6:
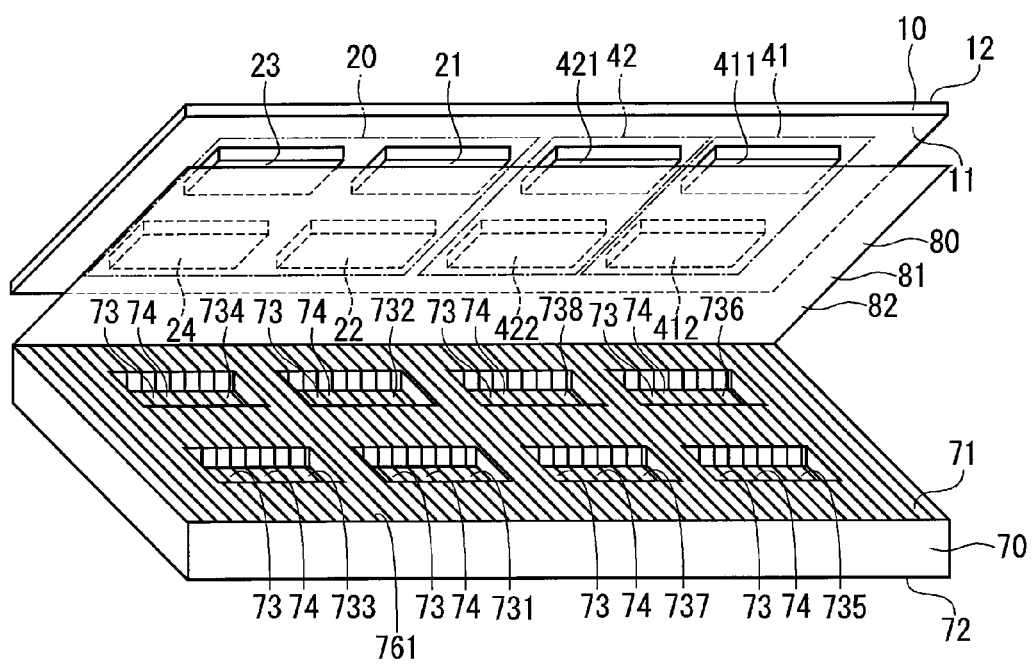
FIG. 6 is a diagram illustrating a partially exploded view of an electric control unit according to a third embodiment of the present disclosure.

A third embodiment of the present disclosure is described below with reference to FIG. 6. The third embodiment differs from the first embodiment in the structure of the heatsink 70.

According to the third embodiment, the heatsink 70 has multiple grooves 761 on the first surface 71 of the heatsink 70 and on the inner walls of the recess 73. The grooves 761 extend in directions parallel to, perpendicular to, or inclined to the first surface 71. For example, the grooves 761 extend straightly and in parallel to each other.

Thus, in the assembled condition of the electronic control unit 1, a movement of the heat-conducting member 80 between the board 10 and the heatsink 70 in the surface direction is restricted by the grooves 761.

As described above, according to the third embodiment, the heatsink 70 has multiple grooves 761 on the first surface 71 of the heatsink 70 and on the inner walls of the recess 73. The grooves 761 extend in directions parallel to, perpendicular to, or inclined to the first surface 71, thereby restricting the movement of the heat-conducting member 80.

Further, the grooves 761 increase the area of the first surface 71 side of the heatsink 70. Thus, the heat of the high-heat-generating devices can be dissipated to the heatsink 70 more highly efficiently.

Further, since the grooves 761 extend in parallel to each other, the grooves 761 can effectively restrict the movement of the heat-conducting member 80, in particular, in a direction perpendicular to the grooves 761.

Fourth Embodiment

Figure 7:
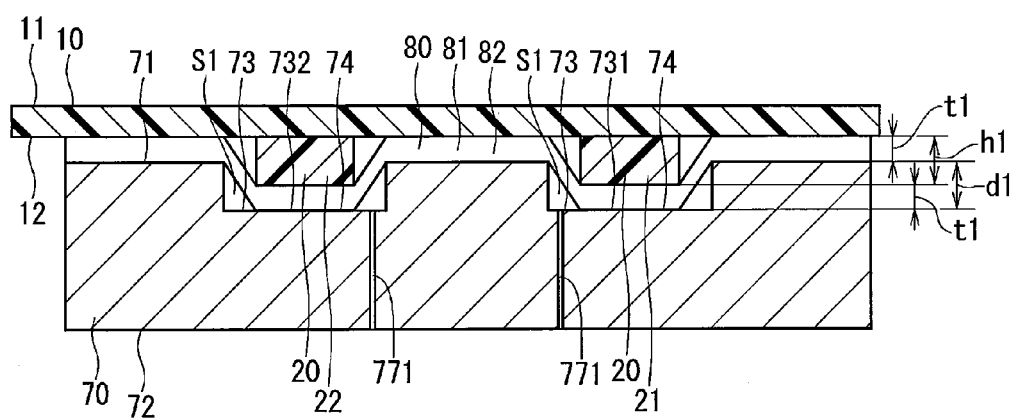
FIG. 7 is a diagram illustrating a partially cross-sectional view of an electric control unit according to a fourth embodiment of the present disclosure.

A fourth embodiment of the present disclosure is described below with reference to FIG. 7. The fourth embodiment differs from the first embodiment in the structure of the heatsink 70.

According to the fourth embodiment, the heatsink 70 has a hole 771 which extends from the recess 73 to the second surface 72. Specifically, the hole 771 extends from the bottom wall 74 of the recess 73 to the second surface 72 and is open to the space S1.

As described above, according to the fourth embodiment, the heatsink 70 has the hole 771 which extends from the recess 73 to the second surface 72 and is open to the space S1 between the recess 73 and the heat-conducting member 80. Thus, air trapped in the space S1 can be discharged through the hole 771 to the second surface 72 side.

Accordingly, the heat of the high-heat-generating devices can be dissipated highly efficiently.

Modifications

While the present disclosure has been described with reference to the embodiments, it is to be understood that the disclosure is not limited to the embodiments. The present disclosure is intended to cover various modifications and equivalent arrangements inside the spirit and scope of the present disclosure. For example, the embodiments can be modified as follows.

In the embodiments, the switching device 20, the relays 41, 42, and the shunt resistor 52 are mounted on the first surface 11 of the board 10, and the capacitor 30 and the coil 51 are mounted on the second surface 12 of the board 10. However, which of the high-heat-generating devices are mounted on the first surface 11 or the second surface 12 of the board 10 are not limited to the embodiments. For example, the shunt resistor 52 may be mounted on the second surface 12 instead of the first surface 11.

The number of the recesses 73 is not limited to a specific number.

The power Zener diode 53 can be mounted on the second surface 12 instead of the first surface 11. The power Zener diode 53 is optional and can be removed if unnecessary.

In the embodiments, the motor 101 is a brushed motor and driven by the H-bridge circuit constructed with the four switching devices 21-24. Alternatively, the motor 101 can be a brushless motor and driven by an inverter controlled by the controller 60. The inverter is constructed with the same number of switching pairs as the phases of the brushless motor. Each switching pair has a high-potential-side switching device and a low-potential-side switching device. For example, when the motor 101 is a three-phase brushless motor, the inverter can be constructed with three switching pairs, i.e., six switching devices. In this case, the motor 101 may be provided with two inverters (i.e., twelve switching devices in total) which are connected in a redundant configuration. In such an approach, even if one inverter is broken, the motor 101 can be driven by the other inverter. That is, the present disclosure can be applied regardless of the number of the switching devices (i.e., high-heat-generating devices) and also regardless of whether the motor 101 is a brushed motor or a brushless motor.

In the embodiments, the high-heat-generating devices mounted on the first surface 11 of the board 10 are shaped like a rectangular plate. However, the high-heat-generating devices mounted on the first surface 11 of the board 10 can be any shape including a polygonal or circular plate and a polygonal or circular column. Likewise, the recess 73 can be any shape as long as it matches the shape of the corresponding high-heat-generating device mounted on the first surface 11.

In the embodiments, the high-heat-generating devices mounted on the first surface 11 of the board 10 have the same height h1, and the recesses 73 have the same depth d1. Alternatively, the high-heat-generating devices mounted on the first surface 11 of the board 10 can have different heights, and the recesses 73 can have different depths.

In the embodiments, the heat-conducting member 80 is in contact with both the board 10 and the heatsink 70. However, it is not always necessary that the heat-conducting member 80 is in contact with the board 10 as long as the heat-conducting member 80 is in contact with at least one high-heat-generating device and at least one recess 73 of the heatsink 70.

In the embodiments, multiple heat-conducting members 80 are integrated as one heat-conducting member 80. Alternatively, each of the heat-conducting members 80 can be individually provided to the corresponding high-heat-generating device. Alternatively, the heat-conducting members 80 can be divided into groups, and the heat-conducting members 80 belonging to the same group can be integrated as one heat-conducting member.

It is not always necessary that all the high-heat-generating devices are provided with the heat-conducting member 80.

In the embodiments, the heat-conducting member 80 includes both the heat-dissipating sheet 81 and the heat-dissipating grease 82. Alternatively, the heat-conducting member 80 can include only one of the heat-dissipating sheet 81 and the heat-dissipating grease 82.

In the embodiments, the bottom wall 74 of the recess 73 is parallel to the first surface 71. Alternatively, the bottom wall 74 can be inclined with respect to the first surface 71.

The grooves 761 of the heatsink 70 can have any depth and width. For example, the number of the grooves 761 per unit area of the first surface 71 can be increased by reducing the width of the grooves 761. In contrast, the area of the first surface 71 can be increased by increasing the depth and width of the grooves 761. Accordingly, the heat of the high-heat-generating devices can be dissipated highly efficiently.

In the embodiments, the grooves 761 are parallel to each other. Alternatively, the grooves 761 can cross each other. In such an approach, the grooves 761 can restrict the movement of the heat-conducting member 80 in a lot of directions.

In the embodiments, the grooves 761 extend straightly. Alternatively, the grooves 761 can be any shape. For example, the grooves 761 can be partially or entirely curved.

In the embodiments, the grooves 761 are formed both on the first surface 71 and on the inner walls of the recess 73. Alternatively, the grooves 761 can be formed on only one of the first surface 71 and the recess 73.

In the embodiments, the hole 771 of the heatsink 70 extends from the recess 73 to the second surface 72. Alternatively, the hole 771 can extend from the first surface 71 to the second surface 72. Further alternatively, the hole 771 can extend from the recess 73 or the first surface 71 to a side surface of the heatsink 70 between the first surface 71 and the second surface 72.

In the embodiments, the depth d1 of the recess 73 of the heatsink 70 is equal to the height h1 of the corresponding high-heat generating device mounted on the first surface 71 of the heatsink 70. Alternatively, the depth d1 of the recess 73 of the heatsink 70 can be different from the height h1 of the corresponding high-heat generating device mounted on the first surface 71 of the heatsink 70.

In the embodiments, the relays 41 and 42 are semiconductor switches. Alternatively, the relays 41 and 42 can be mechanical switches.

In the embodiments, the ignition power source 106 is electrically connected to the node between the relay 41 and the coil 51. Alternatively, the ignition power source 106 can be electrically connected to the opposite side of the relay 41 from the coil 51 or connected to the opposite side of the coil 51 from the relay 41.

In the embodiments, the high-heat-generating device and the low-heat-generating device are surface-mount devices (SMDs). Alternatively, at least one of the high-heat-generating device and the low-heat-generating device can be a through-hole device (THD).

In the embodiments, four switching devices 20 (i.e., 21-24) and one capacitor 30 are used to energize the motor 101. The number of the switching devices 20 and the number of the capacitors 30 can be any numbers.

In the embodiments, the capacitor 30 is an aluminum electrolytic capacitor. However, the capacitor 30 can be any type of capacitor such as a conductive polymer aluminum electrolytic capacitor or a conductive polymer hybrid aluminum electrolytic capacitor.

In the embodiments, the electronic control unit 1 is a separate piece of the motor 101 as a control target. Alternatively, the electronic control unit 1 can be integrated with the motor 101. In this case, the heatsink 70 can be integrated with an end of a frame of the motor 101. In such an approach, the number of parts in the electric power steering apparatus 100 is reduced, and accordingly the size of the electric power steering apparatus 100 is reduced.

In the embodiments, the electronic control unit 1 is used in the electric power steering apparatus 100. Alternatively, the electronic control unit 1 can be used to control a motor or the like of an apparatus other than the electric power steering apparatus 100.

Such changes and modifications are to be understood as being inside the scope of the present disclosure as defined by the appended claims.

What is claimed is:

1. An electronic control unit for controlling a control target, the electronic control unit comprising:
    a board having a first surface and a second surface opposite to the first surface;
    a high-heat-generating device mounted on the first surface of the board and configured to generate heat greater than a predetermined heat value when the electronic control unit operates;
    a controller configured to control the control target by controlling the high-heat-generating device;
    a heat-dissipating member having a first surface located facing the first surface of the board, the first surface of the heat-dissipating member being recessed to form a recess capable of holding the high-heat-generating device, and
    a heat-conducting member located between the board and the heat-dissipating member and in contact with both the high-heat-generating device and the recess to transfer the heat of the high-heat-generating device to the heat-dissipating member, wherein
    the recess is shaped to match a shape of the high-heat-generating device, and
    the high-heat-generating device on the board is surrounded by the heat-conducting member;
    the high-heat-generating device includes a plurality of high-heat-generating devices mounted on the first surface of the board;
    the recess includes a plurality of recesses each corresponding to a different one of the high-heat-generating devices or a part of a different one of the high-heat-generating devices mounted to the first surface of the board;
    the recesses have the same depths from the first surface of the heat-dissipating member; and
    the high-heat-generating devices corresponding to the recesses have the same height from the first surface of the board.

2. The electronic control unit according to claim 1, wherein
    the heat-conducting member is in contact with the board.

3. The electronic control unit according to claim 1, wherein
    the high-heat-generating device is one of a plurality of high-heat-generating devices,
    at least one of the plurality of high-heat-generating devices is mounted on the second surface of the board, and the others of the plurality of high-heat-generating devices are mounted on the first surface of the board,
    the recess is one of a plurality of recesses,
    a number of the plurality of recesses is equal to or less than a number of the others of the plurality of the high-heat-generating devices, and
    each of the plurality of recesses holds any one of the others of the plurality of the high-heat-generating devices.

4. The electronic control unit according to claim 3, wherein
    the heat-conducting member is one of a plurality of heat-conducting members, and
    each of the plurality of heat-conducting members is in contact with a corresponding one of the plurality of high-heat-generating devices.

5. The electronic control unit according to claim 4, wherein
    at least two of the plurality of heat-conducting members are integrated as one heat-conducting member.

6. The electronic control unit according to claim 1, wherein
    the recess has an inner wall connected to the first surface of the heat-dissipating member and inclined with respect to the first surface of the heat-dissipating member.

7. The electronic control unit according to claim 1, wherein
    the heat-dissipating member has a plurality of grooves on the first surface of the heat-dissipating member or in the recess, and
    the plurality of grooves extend in at least one of directions parallel to, perpendicular to, and inclined to the first surface of the heat-dissipating member.

8. The electronic control unit according to claim 7, wherein
    the plurality of grooves are parallel to each other or cross each other.

9. The electronic control unit according to claim 1, wherein
    a depth of the recess from the first surface of the heat-dissipating member is equal to a height of the high-heat generating device from the first surface of the board.

10. An electric power steering apparatus for a vehicle comprising:
    an electronic control unit as defined in claim 1, and
    a control target controllable by the electronic control unit and capable of producing assisting-torque to help a driver to steer the vehicle.

11. The electronic control unit according to claim 1, wherein
    the high-heat-generating device is mounted in contact with the first surface of the board.

12. The electronic control unit according to claim 1, wherein:
the shape of the recess is similar to the shape of the high-heat-generating device.

13. The electronic control unit according to claim 12, wherein:
each side of the recess faces a corresponding side of the high-heat-generating device through the heat-conducting member; and
a bottom of the recess faces a bottom of the high-heat-generating device through the heat-conducting member.

14. The electronic control unit according to claim 13, wherein:
each side of the recess contacts the heat-conducting member, and each side of the high-heat-generating device contacts the heat-conducting member; and
the bottom of the recess contacts the heat-conducting member, and the bottom of the high-heat-generating device contacts the heat-conducting member.

15. The electronic control unit according to claim 1, wherein:
the heat-dissipating member includes a heat-dissipating sheet, which is electrically-insulating;
the heat-dissipating sheet includes a plurality of portions each corresponding to respective different ones of the high-heat-generating devices; and
the plurality of portions are integrally formed in one piece.

16. The electronic control unit according to claim 15, wherein:
the plurality of portions are between the high-heat-generating devices and bottoms of the recesses.

17. The electronic control unit according to claim 1, wherein:
the high-heat-generating devices correspond to the recesses, respectively, one by one.

18. The electronic control unit according to claim 1, wherein:
all of the high-heat-generating devices have the same height.

19. The electronic control unit according to claim 1, wherein:
the recess is in contact with a side wall of the heat conducting member.

20. The electronic control unit according to claim 1, wherein:
each of the recesses has five rectangular inner walls,
each of the high-heat-generating devices has five rectangular outer walls,
the five rectangular outer walls face the five rectangular inner walls, respectively,
the heat conducting member includes an electrically-insulating, heat-dissipating sheet being integrated as one sheet formed to match the high-heat-generating devices held in the recesses, respectively, and
the electrically-insulating, heat-dissipating sheet is, at multiple positions, located between the five rectangular inner walls of the recesses and the five rectangular inner walls.

21. The electronic control unit according to claim 1, wherein:
the heat-conducting member is located between the board and the heat-dissipating member and is in contact with all the high-heat-generating device, the recess, and the board to transfer the heat of the high-heat-generating device to the heat-dissipating member.

22. The electronic control unit according to claim 1, wherein:
the heat-conducting member and the recess form a space therebetween.

23. An electronic control unit for controlling a control target, the electronic control unit comprising:
a board having a first surface and a second surface opposite to the first surface;
a high-heat-generating device mounted on the first surface of the board and configured to generate heat greater than a predetermined heat value when the electronic control unit operates;
a controller configured to control the control target by controlling the high-heat-generating device;
a heat-dissipating member having a first surface located facing the first surface of the board, the first surface of the heat-dissipating member being recessed to form a recess capable of holding the high-heat-generating device, and
a heat-conducting member located between the board and the heat-dissipating member and in contact with both the high-heat-generating device and the recess to transfer the heat of the high-heat-generating device to the heat-dissipating member, wherein
the recess is shaped to match a shape of the high-heat-generating device, and
the high-heat-generating device on the board is surrounded by the heat-conducting member;
the high-heat-generating device includes a plurality of high-heat-generating devices mounted on the first surface of the board;
the recess includes a plurality of recesses each corresponding to a different one of the high-heat-generating devices or a part of a different one of the high-heat-generating devices mounted to the first surface of the board;
the recesses have the same depths from the first surface of the heat-dissipating member;
the high-heat-generating devices corresponding to the recesses have the same height from the first surface of the board; and
the heat-dissipating member has a hole extending from one of the recess and the first surface of the heat-dissipating member to one of a second surface opposite to the first surface of the heat-dissipating member and a side surface between the first surface and the second surface of the heat-dissipating member.

24. The electronic control unit according to claim 23, wherein
the heat-conducting member is in contact with the board.

25. The electronic control unit according to claim 23, wherein
the high-heat-generating device is one of a plurality of high-heat-generating devices,
at least one of the plurality of high-heat-generating devices is mounted on the second surface of the board, and the others of the plurality of high-heat-generating devices are mounted on the first surface of the board,
the recess is one of a plurality of recesses,
a number of the plurality of recesses is equal to or less than a number of the others of the plurality of the high-heat-generating devices, and
each of the plurality of recesses holds any one of the others of the plurality of the high-heat-generating devices.

26. The electronic control unit according to claim 25, wherein the heat-conducting member is one of a plurality of heat-conducting members, and each of the plurality of heat-conducting members is in contact with a corresponding one of the plurality of high-heat-generating devices.

27. The electronic control unit according to claim 26, wherein at least two of the plurality of heat-conducting members are integrated as one heat-conducting member.

28. The electronic control unit according to claim 23, wherein the recess has an inner wall connected to the first surface of the heat-dissipating member and inclined with respect to the first surface of the heat-dissipating member.

29. An electronic control unit for controlling a control target, the electronic control unit comprising:

a board having a first surface and a second surface opposite to the first surface;

a high-heat-generating device connected to the first surface of the board and configured to generate heat greater than a predetermined heat value when the electronic control unit operates;

a controller configured to control the control target by controlling the high-heat-generating device;

a heat-dissipating member having a first surface located on a side of the first surface of the board, the first surface of the heat-dissipating member being recessed to form a recess capable of holding the high-heat-generating device, and a heat-conducting member located between the board and the heat-dissipating member and in contact with both the high-heat-generating device and the recess to transfer the heat of the high-heat-generating device to the heat-dissipating member, wherein the recess is shaped to match a shape of the high-heat-generating device, and the high-heat-generating device is surrounded by the heat-conducting member;

the high-heat-generating device includes a plurality of high-heat-generating devices connected to the first surface of the board;

the recess includes a plurality of recesses each corresponding to a different one of the high-heat-generating devices or a part of a different one of the high-heat-generating devices connected to the first surface of the board;

the recesses have the same depths from the first surface of the heat-dissipating member; and the high-heat-generating devices corresponding to the recesses have the same height.

30. The electronic control unit according to claim 29, wherein the recess has an inner wall connected to the first surface of the heat-dissipating member and inclined with respect to the first surface of the heat-dissipating member.

31. The electronic control unit according to claim 29, wherein the heat-dissipating member has a plurality of grooves on the first surface of the heat-dissipating member or in the recess, and the plurality of grooves extend in at least one of directions parallel to, perpendicular to, and inclined to the first surface of the heat-dissipating member.

32. The electronic control unit according to claim 31, wherein the plurality of grooves are parallel to each other or cross each other.

33. The electronic control unit according to claim 29, wherein the heat-dissipating member has a hole extending from one of the recess and the first surface of the heat-dissipating member to one of a second surface opposite to the first surface of the heat-dissipating member and a side surface between the first surface and the second surface of the heat-dissipating member.

34. The electronic control unit according to claim 29, wherein a depth of the recess from the first surface of the heat-dissipating member is equal to a height of the high-heat generating device from the first surface of the board.

35. An electric power steering apparatus for a vehicle comprising:

an electronic control unit as defined in claim 29, and a control target controllable by the electronic control unit and capable of producing assisting-torque to help a driver to steer the vehicle.

36. The electronic control unit according to claim 29, wherein:

the heat-conducting member is located between the board and the heat-dissipating member and is in contact with all the high-heat-generating device, the recess, and the board to transfer the heat of the high-heat-generating device to the heat-dissipating member.

37. The electronic control unit according to claim 29, wherein:

the heat-conducting member and the recess form a space therebetween.

* * * * *